(12) United States Patent
Nogi et al.

(10) Patent No.: US 10,475,977 B2
(45) Date of Patent: Nov. 12, 2019

(54) LIGHT EMITTING DEVICE

(71) Applicant: NICHIA CORPORATION, Anan-shi (JP)

(72) Inventors: Motohisa Nogi, Itano-gun (JP); Saiki Yamamoto, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/177,330

(22) Filed: Oct. 31, 2018

(65) Prior Publication Data

US 2019/0074420 A1 Mar. 7, 2019

Related U.S. Application Data

(62) Division of application No. 14/944,230, filed on Nov. 18, 2015, now Pat. No. 10,147,856.

(30) Foreign Application Priority Data

Nov. 18, 2014 (JP) .................................. 2014-233564

(51) Int. Cl.
*H01L 33/62* (2010.01)
*H01L 33/48* (2010.01)

(52) U.S. Cl.
CPC .............. *H01L 33/62* (2013.01); *H01L 33/483* (2013.01); *H01L 2224/45144* (2013.01); *H01L 2224/48247* (2013.01); *H01L 2224/48465* (2013.01); *H01L 2224/4903* (2013.01); *H01L 2924/181* (2013.01); *H01L 2924/19107* (2013.01); *H01L 2933/0066* (2013.01)

(58) Field of Classification Search
None
See application file for complete search history.

(56) References Cited

U.S. PATENT DOCUMENTS

2006/0079028 A1* 4/2006 Takahashi ........... H01L 23/3107
438/123
2009/0114936 A1 5/2009 Kashiwao et al.
(Continued)

FOREIGN PATENT DOCUMENTS

JP 2009-111068 5/2009
JP 2009-135496 6/2009
(Continued)

OTHER PUBLICATIONS

Office Action with Form PTO-892 Notice of References Cited issued by the U.S. Patent and Trademark Office for the U.S. Appl. No. 14/944,230, dated Jan. 25, 2018.
(Continued)

*Primary Examiner* — Michelle Mandala
(74) *Attorney, Agent, or Firm* — Mori & Ward, LLP

(57) ABSTRACT

A light emitting device includes an element container and a light emitting element. The element container has a first electrode lead, a second electrode lead, and a resin molded body integrated with the first electrode lead and the second electrode lead and includes an indentation at an outer surface, a wire covered with the resin molded body and extending from the first electrode lead to the indentation. The light emitting element is housed in the element container and electrically connected to the first electrode lead and the second electrode lead.

20 Claims, 3 Drawing Sheets

(56) References Cited

U.S. PATENT DOCUMENTS

| | | |
|---|---|---|
| 2010/0109042 A1 | 5/2010 | Asakawa |
| 2010/0171144 A1 | 7/2010 | Kong et al. |
| 2011/0068450 A1 | 3/2011 | Takahashi |
| 2012/0025361 A1 | 2/2012 | Ito et al. |
| 2014/0070262 A1 | 3/2014 | Yamamoto |

FOREIGN PATENT DOCUMENTS

| | | |
|---|---|---|
| JP | 2010-067770 | 3/2010 |
| JP | 2010-530635 | 9/2010 |
| JP | 2010-251493 | 11/2010 |
| JP | 2011-049245 | 3/2011 |
| JP | 2012-028699 | 2/2012 |
| JP | 2012-175054 | 9/2012 |
| WO | WO 2008/117737 | 10/2008 |
| WO | WO 2009/098967 | 8/2009 |

OTHER PUBLICATIONS

Notice of Allowance issued by the United States Patent and Trademark Office for the U.S. Appl. No. 14/944,230, dated Aug. 13, 2018.

* cited by examiner

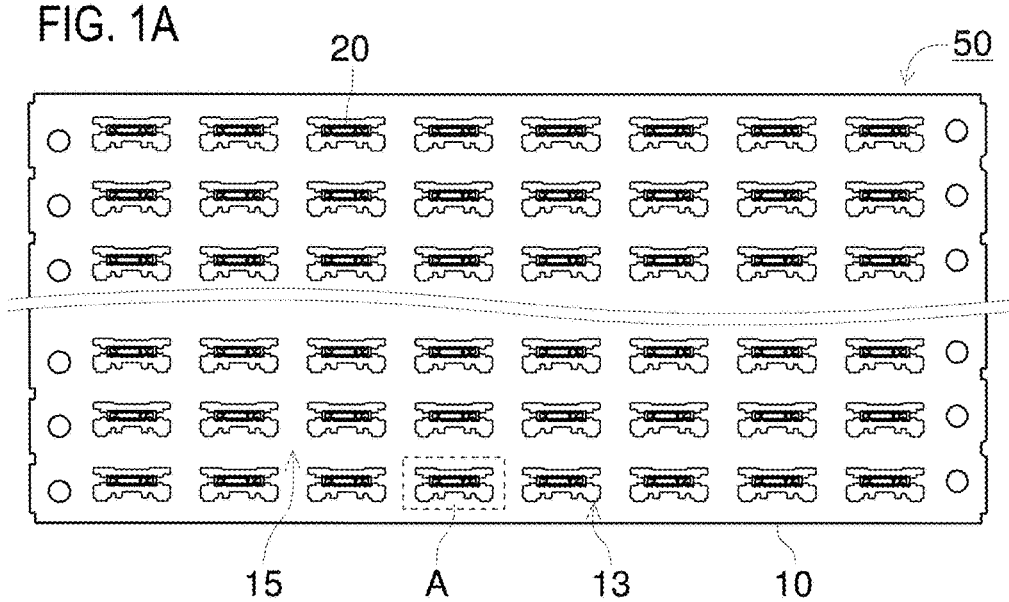
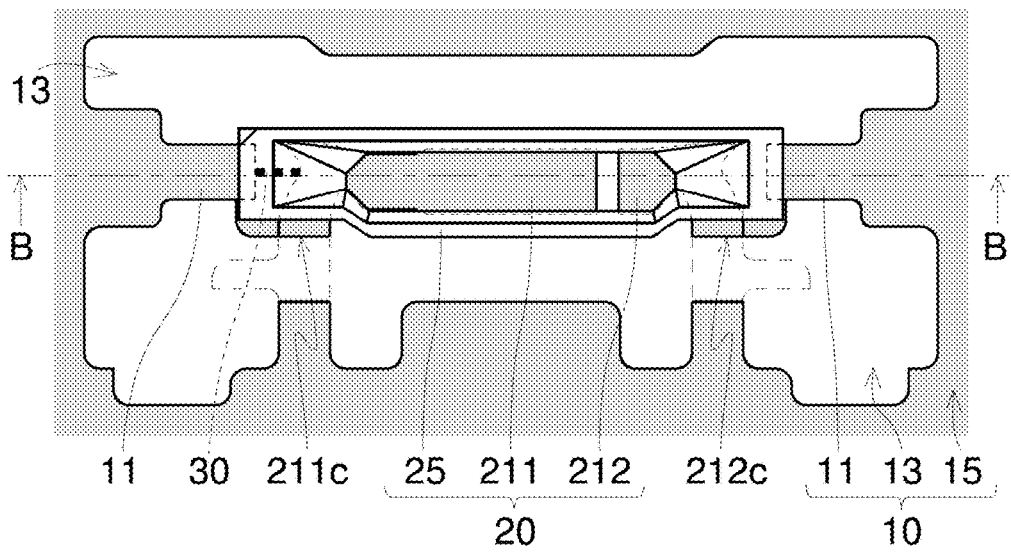

LIGHT EMITTING DEVICE

CROSS-REFERENCE TO RELATED APPLICATION

This is a divisional application of the U.S. patent application Ser. No. 14/944,230 filed on Nov. 18, 2015, which claims priority to Japanese Patent Application No. 2014-233564 filed on Nov. 18, 2014. The contents of these applications are incorporated herein by reference in their entirety.

BACKGROUND

1. Technical Field

The present invention relates to a light emitting device.

2. Description of the Related Art

For example, JP 2011-049245 A (see particularly FIG. 6) discloses a method of manufacturing a side-view type light emitting device.

SUMMARY OF THE INVENTION

According to one aspect of the present invention, a light emitting device includes an element container and a light emitting element. The element container has a first electrode lead, a second electrode lead, and a resin molded body integrated with the first electrode lead and the second electrode lead and includes an indentation at an outer surface, a wire covered with the resin molded body and extending from the first electrode lead to the indentation. The light emitting element is housed in the element container and electrically connected to the first electrode lead and the second electrode lead.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a schematic top view of a composite substrate according to one embodiment of the present invention;

FIG. 1B is a schematic top view showing a region A in FIG. 1A in an enlarged manner;

DESCRIPTION OF THE EMBODIMENTS

Figure 1C:
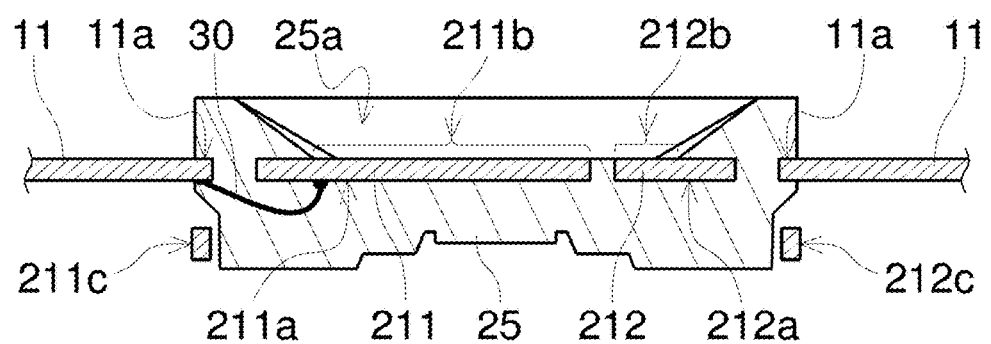
FIG. 1C is a schematic cross-sectional view taken along line B-B in FIG. 1B.

In the following, a description will be given of an embodiment of the present invention with reference to the drawings as appropriate. A composite substrate, a light emitting device, and a method of manufacturing the light emitting device described below are exemplified to embody the technical idea of the present invention. Unless otherwise stated, the present invention is not limited to the embodiment described below. Further, the size or positional relationship of the constituent elements shown in the drawings may be exaggerated for the sake of clarification.

First Embodiment

Composite Substrate

FIG. 1A is a schematic top view of a composite substrate 50 according to a first embodiment. FIG. 1B is a schematic top view showing a region A in FIG. 1A in an enlarged manner. FIG. 1C is a schematic cross-sectional view taken along the line B-B in FIG. 1B.

As shown in FIGS. 1A to 1C, the composite substrate 50 according to the first embodiment is a composite substrate for a light emitting device. The composite substrate 50 includes a plate-like lead frame 10 and a plurality of element containers 20. The lead frame 10 has a plurality of supporting leads 11. The plurality of element containers 20 are supported by corresponding supporting leads 11. Each of the plurality of element containers 20 has a first electrode lead 211, a second electrode lead 212, and a resin molded body 25. The resin molded body 25 is integrated with the first electrode lead 211 and the second electrode lead 212. Further, each of the plurality of element containers 20 holds the first electrode lead 211, the second electrode lead 212, and the supporting leads 11 so as to be spaced apart from one another inside the resin molded body 25. Then, at least one of the plurality of element containers 20 has a wire 30 (a first wire) that connects the first electrode lead 211 and the supporting lead 11 to each other and that is covered with the resin molded body 25. In the composite substrate 50, the number of the element containers 20 that have the wire 30 may be one or two or more, but it is preferable that all the element containers 201 have the wire 30. The wire 30 is preferably entirely located within the resin molded body 25, but the wire 30 may be partially located outer side of the resin molded body 25. In the present specification, the term "within" or "outer side" the resin molded body 25 refers to a side based on the outer surface (the periphery) of the resin molded body 25 in a top view, with the side on which the light emitting element is placed in the element container 20 being regarded as the upper side (the same is applied below).

More specifically, the lead frame 10 is provided with a plurality of openings 13 at approximately equal intervals longitudinally and laterally, and the remainder forms a base frame portion 15 of an approximately grid shape. The lead frame 10 has a pair of supporting leads 11 corresponding to each opening 13. The pair of supporting leads 11 extends toward the center of the opening 13 from the opposite sides of the base frame portion 15. Each of the element containers 20 holds tip regions 11a of the pair of supporting leads within the resin molded body 25, thus, each of the element containers 20 are supported by the pair of supporting leads 11. The lead frame 10 includes the first electrode lead 211 and the second electrode lead 212 corresponding to each opening 13 before the first electrode lead 211 and the second electrode lead 212 are separated from the lead frame 10, and the first electrode lead 211 and the second electrode lead 212 extend from the base frame portion 15 toward the center of the opening 13. The resin molded body 25 of each element container defines an element container recess 25a for housing a light emitting element. The bottom surface of the element container recess 25a is formed to partially include portions of the upper surfaces of the first electrode lead 211 and the second electrode lead 212 (that are referred to as a first exposed region 211b and a second exposed region 212b, respectively). Within the resin molded body 25, a portion of the first electrode lead 211 and a portion of the second electrode lead 212 that are covered with the resin molded body 25 are referred to as a first covered region 211a and a second covered region 212a, respectively. Portions of the first electrode lead 211 and the second electrode lead 212 that are located at outer side of the resin molded body 25 are separated from the lead frame 10 and serve as a first external terminal region 211c and a second external terminal region 212c, respectively. The first external terminal region 211c and the second external terminal region 212c respectively have an approximately L-shape as shown by the broken lines in FIG. 1B prior to being separated from the lead frame 10 and bent. Note that, FIGS. 1A to 1C show, in solid lines, the first external terminal region 211c and the second external terminal region 212c in a state separated from the lead frame 10 and bent. Then, the wire 30 connects the first covered region 211a of the first electrode lead and the tip region 11a of the supporting lead.

The composite substrate 50 with such a configuration is provided such that, in each element container 20 having the wire 30, the first electrode lead 211 is electrically connected to the lead frame 10 (particularly the base frame portion 15) via the wire 30. Therefore, even in the case where the first electrode lead 211 and the second electrode lead 212 are separated from the lead frame 10 and then further bent, the electrical continuity test of the light emitting element and/or the light emission test of the light emitting device can be performed with relatively good work efficiency. The wire 30 may be connected to the second electrode lead 212 instead of to the first electrode lead 211. Further, the wire 30 preferably connects one of the first electrode lead 211 and the second electrode lead 212 to the supporting lead 11. Alternatively, the wire 30 may connect the first electrode lead 211 and one supporting lead 11, and connect the second electrode lead 212 and the other supporting lead 11. This case is advantageous in facilitating the use of a wire bonding apparatus that does not equipped with a polarity inversion function for the electrical continuity test of the light emitting element, using the non-bonding detecting function of the wire bonding device, to be described below.

Preferable embodiments of the composite substrate 50 will be described below.

As shown in FIGS. 1A to 1C, in the element container 20 having the wire 30, the first electrode lead 211 and the second electrode lead 212 are separated from the lead frame 10. In such a case, in absence of the wire 30, the electrical continuity test of the light emitting element or the light emission test of the light emitting device requires a work of successively connecting respective test terminals to the first electrode lead 211 (for example, the first external terminal region 211c) and the second electrode lead 212 (for example, the second external terminal region 212c) of each of the element containers 20. But in the case where the first electrode lead 211 is electrically connected to the lead frame 10 by the wire 30, the work can be reduced to connecting one test terminal to a predetermined location of the lead frame 10 (for example, the base frame portion 15) and then successively connecting the other test terminal to the second electrode lead 212 (for example, to the second external terminal region 212c) of each of the element containers 20. As described above, in the case of separating the first electrode lead 211 and the second electrode lead 212 from the lead frame 10, the advantage of the presence of the wire 30 will be more significant. Further, in the case where the first electrode lead 211 and the second electrode lead 212 are separated from the lead frame 10 in the composite substrate 50, the stress that may occur at the time of separation can be prevented from adversary affecting the light emitting element and/or the sealing member.

As shown in FIGS. 1A to 1C, the element container 20 having the wire 30 includes the first electrode lead 211 and the second electrode lead 212 that are bent along the outer surface of the resin molded body 25 at outer side of the resin molded body 25. In such a case, in absent of the wire 30, the electrical continuity test of the light emitting element or the light emission test of the light emitting device requires further complicated works in successively connecting respective test terminals to the first electrode lead 211 and the second electrode lead 212 of each of the element containers 20. Accordingly, in the case where the first electrode lead 211 and the second electrode lead 212 are respectively separated from the lead frame 10 and further bent along the outer surface of the resin molded body 25 at outer side of the resin molded body 25, the advantage of the presence of the wire 30 will be further significant. Further, in the case where the first electrode lead 211 and the second electrode lead 212 are bent along the outer surface of the resin molded body 25 at outer side of the resin molded body 25 in the composite substrate 50, the stress that may occur at the time of bending can be prevented from adversary affecting the light emitting element and/or the sealing member. Note that, in the case of the element container substantially does not allow bending of the first electrode lead 211 and the second electrode lead 212 at outer side of the resin molded body 25 (for example, the first electrode lead 211 and the second electrode lead 212 respectively have a flat plate-like shape), the wire 30 can exhibit the effect described above.

As shown in FIG. 1C, the wire 30 is preferably bonded to the supporting lead 11 by way of wedge bonding. The bonding strength of wedge bonding is lower than that of ball bonding. Therefore, in removing the element container 20 (the light emitting device) from the supporting lead 11, the wire 30 can be easily detached from the supporting lead 11 so that damage of the element container 20 can be greatly reduced. Further, the height of the wire 30 near the connection portion to the supporting lead 11 can be easily reduced in wedge bonding. Therefore, interference between the mold assembly of the resin molded body 25 and the wire 30 can be easily avoided, and the wire 30 can be easily covered with the resin molded body 25.

As shown in FIGS. 1B and 1C, assuming the side of the element container 20 on which the light emitting element is placed to be the upper side, the wire 30 preferably connects the lower surface of the first electrode lead 211 (the first covered region 211a) and the lower surface of the supporting lead 11 (the tip region 11a). The element container recess 25a is arranged in the side of the element container 20 on which the light emitting element to be placed, so that in the case of arranging the resin molded body 25 both the upper and lower sides of the first electrode lead 211, the volume of the resin molded body 25 tends to be greater on the lower side than on the upper side of the first electrode lead 211. Accordingly, in the case where the wire 30 connects the lower surface of the first electrode lead 211 and the lower surface of the supporting lead 11, the wire 30 can be easily covered with the resin molded body 25. Further, light emitted from the light emitting element can be easily suppressed or prevented from being absorbed by the wire 30. Meanwhile, the wire 30 may connect the upper surface of the first electrode lead 211 and the upper surface of the supporting lead 11. This is suitable for an element container in which the first electrode lead 211 and the second electrode lead 212 are not substantially bent at outer side of the resin molded body 25, and the resin molded body 25 is substantially absent at a lower side of the lowermost surface of the first electrode lead 211 and the second electrode lead 212. That is, the configuration is suitable for an element container in which the lowermost surface of the first electrode lead 211 and the lowermost surface of the second electrode lead 212 are substantially flush with the lowermost surface of the resin molded body 25 and exposed. In this case, the resin molded body 25 is also formed on the lower side of the tip region 11a of the supporting lead, and further, in order to prevent unintended removal of the element container from the supporting lead, it is preferable that a continuous recess extending from the tip surface to the lower surface is arranged or the lower surface is inclined to reduce the thickness of the tip side.

Method of Manufacturing Light Emitting Device

FIGS. 2A to 2E are schematic cross-sectional views showing one example of a method of manufacturing a light emitting device 100 according to the first embodiment. The method of manufacturing the light emitting device 100 according to the first embodiment includes at least four steps illustrated below performed in this order. In FIGS. 2A to 2E, one of the plurality of element containers 20 in the composite substrate 50, i.e., one light emitting device 100, is shown. But it is preferable that the respective steps are performed simultaneously on the plurality of element containers 20 in the composite substrate 50, i.e., on the plurality of light emitting devices 100.

Figure 2A:
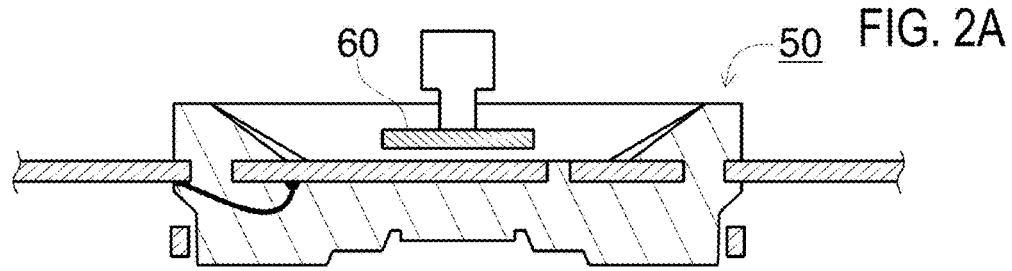
FIGS. 2A to 2E are schematic cross-sectional views showing one example of a method of manufacturing a light emitting device according to one embodiment of the present invention.

First, providing a composite substrate 50 (shown in FIG. 2A). The composite substrate 50 may be manufactured, or may be a commercially available product. Manufacturing the composite substrate 50 includes placing a plurality of wires 30 at predetermined locations of the lead frame 10, and molding resin molded bodies 25 on the lead frame 10 using a mold assembly so as to cover the wires 30. Further, after molding the resin molded bodies 25, it is preferable that the first electrode leads 211 and the second electrode leads 212 are separated from the lead frame 10 and bent along the outer surfaces of the resin molded bodies 25 at outer sides of the resin molded bodies 25, respectively. The composite substrate 50 shown in FIGS. 1A to 1C is used.

Figure 2B:
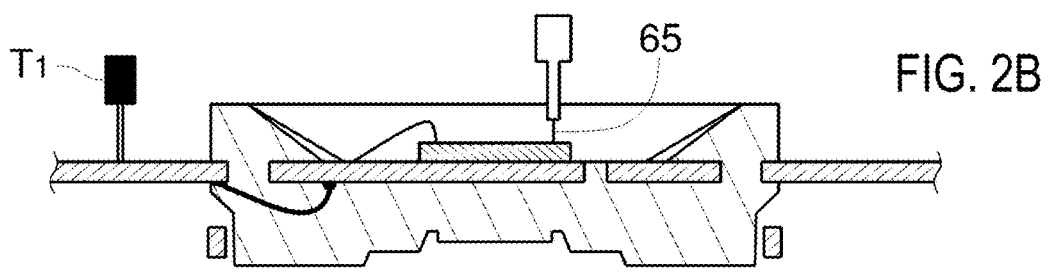

Next, housing a light emitting element 60 in each element container 20 having a wire 30, and electrically connecting the light emitting element 60 to the first electrode lead 211 and the second electrode lead 212. As shown in FIG. 2A, the light emitting element 60 is housed in the element container 20 having the wire 30. More specifically, the light emitting element 60 is bonded to the bottom surface of the element container recess 25a with the use of an adhesive agent, for example. Then, as shown in FIG. 2B, the light emitting element 60 is electrically connected to the first electrode lead 211 and the second electrode lead 212. More specifically, the positive and negative electrodes of the light emitting element 60, the first electrode lead 211, and the second electrode lead 212 are respectively connected to each other with wires 65 (second wires), for example.

Then, inspecting electrical continuity of the light emitting element 60 in a state where the first electrode lead 211 and the second electrode lead 212 are separated from the lead frame 10. The step of inspecting can be performed, for example, in connecting the wires 65 (the second wires) to the light emitting element 60 as shown in FIG. 2B. This step of inspecting is performed using the non-bonding detecting function of a wire bonding device. More specifically, for example, a test terminal $T_1$ electrically connected to a wire bonding device is connected to a predetermined location of the lead frame 10 (for example, the base frame portion 15). Simultaneously with completion of the connection of the wires 65 (the second wires) to the light emitting element 60, electric conduction to the light emitting element 60 can be detected by the wire bonding device. In this case, the wire 65 (the second wire) held by the wire bonding device can be regarded as the other test terminal). Alternatively, after completion of the electrical connection of the light emitting element 60 to the first electrode lead 211 and the second electrode lead 212, one test terminal $T_1$ is connected to a predetermined location of the lead frame 10 (for example, the base frame portion 15), and then the other test terminal (corresponding to $T_2$ in FIG. 2D) is successively connected to the second electrode lead 212 of each of the element containers 20. Thus, inspecting the electrical continuity to the light emitting element 60 housed in each element container 20. In the case where the wire 30 is connected to the second electrode lead 212, the other test terminal can be successively connected to the first electrode lead 211 of each of the element containers 20.

Figure 2C:
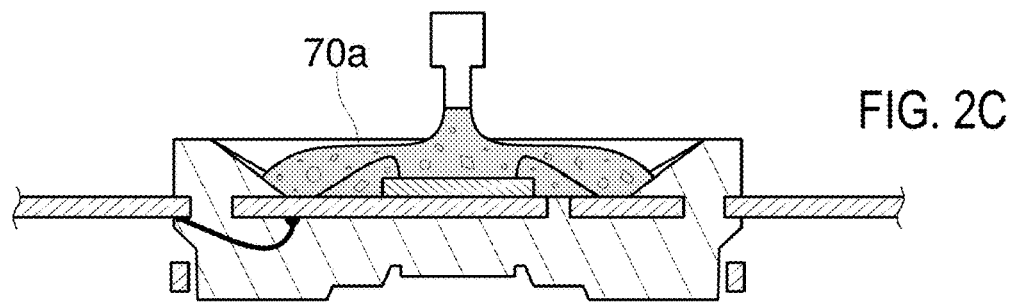
Figure 2D:
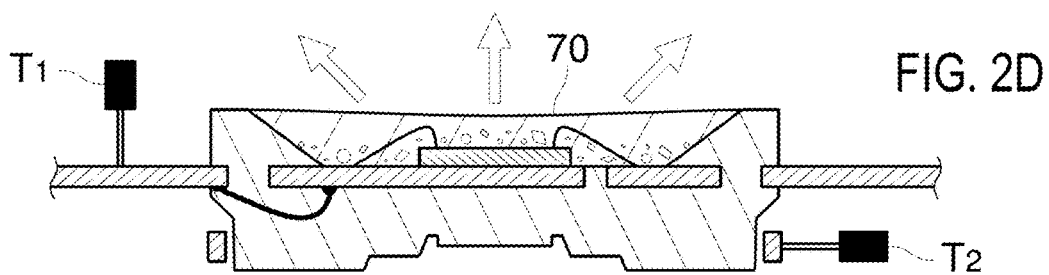
Figure 2E:
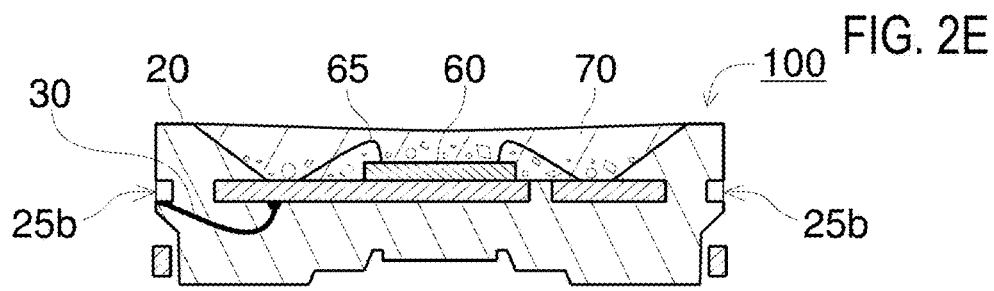

Next, as shown in FIG. 2E, removing the element containers 20, i.e., the light emitting devices 100, from the supporting lead 11. For example, pressing the element container 20 upward or downward by using a mold or a jig, the element container 20, i.e., the light emitting device 100, can be removed from the supporting lead 11. At this time, in view of ease of detachment of the wire 30 from the supporting lead 11, in the case where the wire 30 connects the lower surface of the first electrode lead 211 and the lower surface of the supporting lead 11, it is preferable to push the element storage 20 downward from above. Conversely, in the case where the wire 30 connects the upper surface of the first electrode lead 211 and the upper surface of the supporting lead 11, it is preferable to push the element container 20 upward from below. With the step of removing the element containers, indentations 25b are formed in the outer surface of the resin molded body 25. The indentations 25b correspond to the portions where the tip regions 11a of the supporting leads are held at the resin molded body 25. Further, the wire 30 is detached from the supporting lead 11, and the entire or almost the entire wire 30 (for example, the wire 30 in the state where only the portion around the connection portion to the supporting lead 11 is absent) remains in the element container 20.

As shown in FIG. 2C, the first embodiment includes, after the step of placing a light emitting element (in the present embodiment, after the step of inspecting electrical continuity), forming a sealing member 70 (shown in FIG. 2D) sealing the light emitting element 60 (the fifth step). The sealing member 70 is formed filling a liquid material 70a (in the present embodiment, containing a fluorescent material) of a sealing member in the element container recess 25a, and curing the liquid material 70a by way of thermal treatment or the like. Thus, the light emitting device 100 is formed on the lead frame 10.

Further, as shown in FIG. 2D, the first embodiment, includes, after the step of framing the sealing member, a step of allowing the light emitting device to emit light in a state where the first electrode lead 211 and the second electrode lead 212 are separated from the lead frame 10. For example, one test terminal $T_1$ is connected to a predetermined portion of the lead frame 10 (for example, the base frame portion 15), and the other test terminal $T_2$ is successively connected to the second electrode lead 212 of each of the element containers 20, and allowing the light emitting element 60 housed in each of the element containers 20 to emit light. The luminous intensity, chromaticity and the like are measured as appropriate. Note that, the step of inspecting electrical continuity of the light emitting element can be included in the step of allowing the light emitting device to emit light, and a separate step of inspecting may be omitted.

According to the method of manufacturing the light emitting device 100 having a configuration as described above, the first electrode lead 211 is electrically connected to the lead frame 10 (particularly to the base frame portion 15) via the wire 30, so that even in the state where the first electrode lead 211 and the second electrode lead 212 are separated from the lead frame 10, the electrical continuity test of the light emitting element 60 and/or the light emission test of the light emitting device 100 can be performed with relatively good work efficiency.

Light Emitting Device

As shown in FIG. 2E, the light emitting device 100 according to the first embodiment includes the element container 20, and the light emitting element 60 housed in the element container 20. The element container 20 has the first electrode lead 211, the second electrode lead 212, the resin molded body 25, and the wire 30. The resin molded body 25 is integrated with the first electrode lead 211 and the second electrode lead 212. Further, the resin molded body 25 includes the indentations 25b at the outer surface. The wire 30 is covered with the resin molded body 25, and extends from the first electrode lead 211 to the indentation 25b. The light emitting element 60 is electrically connected to the first electrode lead 211 and the second electrode lead 212.

The light emitting device 100 having such a configuration has the wire 30 that extends from the first electrode lead 211 to the indentation 25b. Therefore, the electrical continuity test of the light emitting element 60 and/or the light emission test of the light emitting device 100 can be performed with relatively good work efficiency. Note that, as shown in FIG. 2E, the light emitting device 100 may include the sealing member 70 sealing the light emitting element 60.

As shown in FIG. 2E, the light emitting element 60 is preferably placed on the first electrode lead 211. In other words, in the element container 20, the first electrode lead 211 preferably has the light emitting element 60 placed thereon. The electrode lead on which the light emitting element is placed generally has a relatively large area in a top view (in a plan view) in order to secure the mounting region for the light emitting element. In the present embodiment, the first electrode lead 211 has a larger area in a top view than the second electrode lead 212. In this manner, by connecting the wire 30 to the first electrode lead 211 on which the light emitting element is placed, the wire 30 can be easily provided to the element container 20. Further, the heat generated by the light emitting element 60 can be radiated via the wire 30.

As shown in FIG. 2E, the light emitting device 100 is preferably a side-surface light emitting type (side-view type) light emitting device. In other words, the element container 20 is preferably an element container for a side-surface light emitting type light emitting device. The element container 20 for a side-surface light emitting type light emitting device is provided such that the first electrode lead 211 and the second electrode lead 212 are in many cases folded along the outer surface of the resin molded body 25 at outer side of the resin molded body 25, which facilitates advantage of the presence of the wire 30. Further, the element container 20 of a side-surface light emitting type light emitting device has a small size (i.e., a thin type), and the first electrode lead 211 and the second electrode lead 212 are also made smaller in size. This makes it difficult to connect a test terminal to the first electrode lead 211 and/or the second electrode lead 212, which facilitates advantage of the presence of the wire 30.

Each component of the composite substrate and the light emitting device according to certain embodiments of the present invention will be described below.

Composite Substrate 50

The composite substrate includes at least the lead frame and the plurality of element containers disposed on the lead frame. The plurality of element containers at the composite substrate are generally arranged at approximately equal intervals longitudinally and laterally on the lead frame. The composite substrate may be, for example, so-called called a "package array" or the like.

Lead Frame 10

The base member of the lead frame can be a flat plate of copper, aluminum, gold, silver, tungsten, iron, nickel, cobalt, molybdenum, or alloy of the foregoing metals, processed with pressing (e.g., punching), etching, rolling, or the like. The lead frame may have a layered-body of such metals or alloy, but a single-layer body is preferable for its simplicity. In particular, a copper alloy (such as phosphor bronze or copper-iron alloy) whose main component is copper is preferable. Further, a light reflective film of silver, aluminum, rhodium or an alloy of the foregoing metals may be provided on the surface of the lead frame. Of those, silver or an alloy of silver is preferable for its good light reflecting properties. The lead frame may have an appropriate thickness, for example, a thickness in a range of 0.05 mm to 1 mm, preferably 0.1 mm to 0.4 mm, and more preferably 0.1 mm to 0.3 mm may be employed.

Element Container 20

The element container is a container housing the light emitting element and having electrodes (terminals) for supplying external power to the light emitting element. The element container includes at least the first electrode lead, the second electrode lead, and the resin molded body. In the present embodiment, the element container further includes the wire (the first wire). The element container may be, for example, a so-called "package" or the like. Further, the element container is not limited to an element container for a side-surface light emitting type light emitting device, but also includes an element container for an upper-surface light emitting type (top-view type) light emitting device.

First Electrode Lead 211, Second Electrode Lead 212

The first electrode leads and the second electrode leads are small pieces included in the lead frame. One of the first electrode leads and one of the second electrode leads can serve as a pair of positive and negative electrodes (terminals) in each of the element containers. One element container includes at least a pair of the first electrode lead and the second electrode lead, but plural pairs of them may be included in one element container. In the case of including a plurality of pairs of the first electrode lead and the second electrode lead, the wire (the first wire) is preferably provided for each of the pairs.

Resin Molded Body 25

The resin molded body serves as a base member of the element container. In view of light reflectivity, the resin molded body preferably exhibits a light reflectivity in the emission peak wavelength of the light emitting element of 75% or more, and more preferably 90% or more. Further, the resin molded body preferably has a white color. Before being cured, the resin molded body is in a flowable state, i.e., in a liquid state (inclusive of sol state or slurry state). The resin molded body can be obtained by way of injection molding, transfer molding or the like. For the base member of the resin molded body, a thermosetting resin or a thermoplastic resin can be used. Particularly, thermoplastic resins are relatively flexible, which can facilitate reduction of damage such as cracks or chipping on the resin molded body, at the time of removing the element containers from the support lead. Moreover, thermoplastic resins are relatively inexpensive. Thermosetting resins exhibit relatively low viscosities in a liquid state, which can facilitate reduction of breakage of the wire (the first wire) at the time of molding the resin molded body. The thermosetting resin may be any one of epoxy resin, silicone resin, polyimide resin, polyurethane resin, polybismaleimide triazine resin, unsaturated polyester, or a modified resin or a hybrid resin of the foregoing resins. Of those, epoxy resin, silicone resin, unsaturated polyester, or a modified resin or a hybrid resin of the foregoing resins is preferable. In particular, unsaturated polyester, or a modified resin or a hybrid resin thereof is suitable, because it is applicable to injection molding while exhibiting excellent characteristics of the thermosetting resin. The thermoplastic resin may be any one of alicyclic polyamide resin, semi-aromatic polyamide resin, polyethylene terephthalate, polycyclohexane terephthalate, liquid crystal polymer, polycarbonate resin, syndiotactic polystyrene, polyphenylene ether, polyphenylene sulfide, polyethersulfone resin, polyetherketone resin, polyarylate resin, or a modified resin or a hybrid resin of the foregoing resins. Of those, alicyclic polyamide resin, polycyclohexane terephthalate, or a modified resin or a hybrid resin of the foregoing resins is preferable. In view of light reflectivity, mechanical strength, thermal expandability and the like, a white pigment and a filler agent as shown below are preferably contained in the base member of the resin molded body, but it is not limited thereto.

White Pigment

The white pigment may be titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide or the like. One of the foregoing materials can be used singly or in a combination of two or more of the foregoing materials as the white pigment. Of those, titanium oxide is preferable, because of its relatively high refractive index and good light-shielding performance. The shape of the white pigment can be appropriately specified, and an irregular shape (a crushed state) may be employed, but in view of flowability, a spherical shape is preferable.

Filler

The filler may be silica, aluminum oxide, glass, potassium titanate, wollastonite (calcium silicate), mica, talc or the like. One of the foregoing materials can be used singly or in a combination of two or more of the foregoing materials as the filler. Note that, a substance different from the white pigment described above is employed as the filler. The shape of the filler can be appropriately specified, and an irregular shape (a crushed state) may be employed, but in view of a reinforcing agent, a fibrous shape or a plate shape (a scaly shape) is preferable, and in view of flowability, a spherical shape is preferable.

Wire 30

The wire (the first wire) is an electrically conductive wire connecting the supporting lead and the electrode lead. More specifically, a metal wire (as used herein "metal" includes alloy) of gold, copper, silver, platinum, aluminum or alloy of the foregoing metals may be employed. In particular, gold or gold alloy is preferable because breakage of the wire due to stress from the resin molded body or the like is not easily occur. Further, copper or copper alloy is preferable in view of heat releasing performance. Still further, in order to increase the light reflectivity, at least the surface of the wire may be made of silver or silver alloy. At least one wire is employed for connecting one of either the first electrode lead or the second electrode lead to the supporting lead, but a plurality of wires may be employed in case of breakage of the wire or the like. The diameter of the wire can be appropriately specified, and for example, a diameter in a range of 5 μm to 2 mm can be employed. In view of securing the mechanical strength (avoiding breakage) and/or of heat releasing performance, a lower limit value is preferably 15 μm or greater, and more preferably 20 μm or greater.

In view of ease of detachment from the supporting lead at the time of removing the element container (light emitting device) from the supporting lead, a higher limit value is preferably 100 μm or less, and more preferably 50 μm or less. The upper limit value also depends on the size of the tip region of the supporting lead, and thus the foregoing values are preferable. Note that, for the second wire connecting the light emitting element and the electrode lead, a wire similar to the first wire can be used. In view of avoiding breakage at the time of molding the resin molded body, the diameter of the wire (the first wire) is preferably larger than the diameter of the second wire.

Light Emitting Device 100

In the light emitting device, the light emitting element is housed in the element container and is electrically connected to the first electrode lead and the second electrode lead, and sealed. The light emitting device may be, for example, so-called a "light emitting diode (LED)" or the like. Further, the light emitting device is not limited to a side-surface light emitting type light emitting device, but also includes an upper-surface light emitting type (top-view type) light emitting device.

Light Emitting Element 60

The light emitting element may be a semiconductor light emitting element such as an LED element. In many cases, the light emitting elements include a substrate, but the light emitting elements are to include at least an element structure made of a semiconductor of various types, and a pair of positive and negative electrodes. In particular, a light emitting element of a nitride semiconductor ($In_xAl_yGa_{1-x-y}N$, $0 \le x$, $0 \le y$, $x+y \le 1$) configured to emit light in a range of ultraviolet region to visible light region is preferable. Alternatively, a light emitting element of a gallium arsenide-based semiconductor or a gallium phosphide-based semiconductor configured to emit light in a range of green to red-color may be employed. In the case of a light emitting element in which a pair of positive and negative electrodes are provided at a same surface side, the electrodes are respectively connected to the first electrode lead and the second electrode lead by the wires (the second wires) (i.e., face-up mounting). The electrodes may be respectively connected to the first electrode lead and the second electrode lead by a conductive adhesive agent (i.e., flip-chip mounting (face-down mounting)). In the case where a light emitting element has an opposite electrode structure in which a pair of positive and negative electrodes are respectively arranged on opposite surfaces, a lower surface electrode is connected to one electrode lead (for example first electrode lead) by a conductive adhesive agent, and an upper surface electrode is connected to the other electrode lead (for example, second electrode lead) by the wire (second wire). The number of the light emitting elements mounted on one element container may be one or plural. A plurality of light emitting elements can be connected in series or in parallel by the wires (the second wires). Further, for example, three light emitting elements respectively configured to emit blue-, green-, and red-color light may be mounted in one element container.

Sealing Member 70, Liquid Material 70a of Sealing Member

The sealing member is a member that seals the light emitting element and protects the light emitting element from dust, moisture, external force and the like. The sealing member is electrically insulating, and transmissive to light emitted from the light emitting element (preferably has a light transmissivity to the emission peak wavelength of the light emitting element of 70% or greater, more preferably 85% or greater). The base material of the sealing member may be silicone resin, epoxy resin, phenol resin, polycarbonate resin, acrylic resin, TPX resin, polynorbornene resin, or a modified resin or a hybrid resin of the foregoing resins. Of those, silicone resin, or a modified resin or hybrid resin thereof is preferable for its good heat-resistance and light-fastness, and small reduction in volume after being cured. The sealing member preferably contains a fluorescent material in the base material, the present invention is not limited thereto.

Fluorescent Material

The fluorescent material absorbs at least a portion of primary light emitted from the light emitting element, and emits secondary light that has a different wavelength from the primary light. More specifically, the fluorescent material may be cerium-activated yttrium-aluminum-garnet, europium and/or chromium-activated nitrogen-containing calcium aluminosilicate, europium-activated sialon, europium-activated silicate, manganese-activated potassium fluosilicate or the like. The fluorescent material may be quantum dots. The quantum dots may be particles with a particle size in a range of 1 nm to 100 nm, and the emission wavelength can be changed according to the particle size. The quantum dots may be, for example, cadmium selenide, cadmium telluride, zinc sulfide, cadmium sulfide, lead sulfide, lead selenide, cadmium telluride, mercury or the like. One of the foregoing materials may be used singly or in a combination of two or more of the foregoing materials, as the fluorescent material. Thus, the light emitting device can be configured to emit a mixed light (for example, a white-color light) of the primary light and the secondary light of visible wavelength.

EXAMPLES

Examples according to embodiments of the present invention will be described in detail below. Note that, the present invention is not limited only to the Examples shown below.

Example 1

A composite substrate according to Example 1 is a package array for a side-surface light emitting type LEDs, and has a configuration of the composite substrate 50 illustrated in FIGS. 1A to 1C. In the description below, the longitudinal and lateral (i.e., right and left) directions are indicated based on the orientation of the composite substrate shown in FIG. 1A.

The lead frame 10 is a metal plate provided with a light reflective film made of silver on a base member that is made of copper-iron alloy and subjected to punching work to form the openings 13. The outer shape of the lead frame 10 is an approximately rectangular shape having a longitudinal length of 204 mm, a lateral width of 60 mm, and a thickness of 0.11 mm. The element containers 20 are provided by 60 pieces longitudinally and 8 pieces laterally on the lead frame 10 at substantially equal intervals. Each element container 20 is supported by a pair of supporting leads 11 extending from right and left base frame portions 15 in each opening 13. Each element container 20 has an outer shape having a longitudinal length of 0.4 mm, a lateral width of 3.0 mm, and a thickness of 0.85 mm and includes the resin molded body 25 defining the element container recess 25 of a longitudinal length of 0.29 mm, a lateral width of 2.2 mm, and a depth of 0.3 mm in the upper surface side. The resin molded body 25 contains a white pigment of titanium oxide and a filler of spherical silica and fibrous wollastonite in a base material of alicyclic polyamide resin. The first electrode lead and the second electrode lead respectively have, as portions located within the resin molded body 25, the first covered region 211a and the second covered region 212a covered with the resin molded body 25 and the first exposed region 211b and the second exposed region 212b that partially form the bottom surface of the element container recess 25a. The first exposed region 211b includes a mounting region for the light emitting element, and is larger than the second exposed region 212b. Further, the first electrode lead and the second electrode lead respectively have, as portions located at outer side of the resin molded body 25, the first external terminal region 211c and the second external terminal region 212c. The first external terminal region 211c and the second external terminal region 212c are separated from the lead frame 10, and bent to extend from one of the outer surfaces of the resin molded body 25 (the main surface on the mounting side) along the outer surface. The first external terminal region 211c and the second external terminal region 212c are further bent along other outer surfaces (right and left end surfaces). The tip region 11a of the supporting lead has a longitudinal length of 0.2 mm, and a rectangular parallelepiped-shaped portion with a lateral width of 70 μm from the tip surface is held in the resin molded body 25. One wire 30 is provided for each of all the element containers 20 on the composite substrate 50. The wire 30 is ball bonded to the lower surface of the first electrode lead (the first covered region 211a), and wedge bonded to the lower surface of the tip region 11a of the supporting lead in the resin molded body 25. The wire 30 is a gold wire with a diameter of 30 μm.

The composite substrate according to Example 1 as described above can exhibit advantageous effects similar to those exhibited by the composite substrate 50 according to the first embodiment.

The light emitting device according to the embodiment of the present invention can be used for a backlight device of a liquid crystal display, various illumination devices, a large-size display, various display apparatuses such as an advertisement or a destination guide, a projector apparatus, and furthermore, an image reading apparatus in a digital video camera, a facsimile, a copier, a scanner and the like.

As shown in the above, a semiconductor light emitting element and a method of manufacturing the semiconductor light emitting element are illustrated in accordance with the embodiments for carrying out the present invention, but the scope of the invention is not limited to the above description, and should be widely understood based on the scope of claim for patent. Further, based on the above description, it will be obvious that various changes and modifications can be made therein without departing from the scope of the invention.

What is claimed is:

1. A light emitting device comprising:
    a light emitting element to emit a light;
    an element container accommodating the light emitting element and having an inner surface facing the light emitting element and an outer surface opposite to the inner surface, the element container comprising:
- a first electrode lead electrically connected to the light emitting element to extend to the outer surface;
- a second electrode lead electrically connected to the light emitting element to extend to the outer surface; and
- a resin molded body integrated with the first electrode lead and the second electrode lead and having an indentation in the outer surface, the resin molded body being made of a first material;
- a sealing member made of a second material different from the first material and covering the light emitting element such that the light emitting element is provided between the sealing member and the first electrode lead; and
- a wire provided in the resin molded body and extending from the first electrode lead to the indentation such that the wire is not provided in the sealing member.

2. The light emitting device according to claim 1, wherein the light emitting element is placed on the first electrode lead.

3. The light emitting device according to claim 1, wherein the light emitting device is a side-surface light emitting type light emitting device.

4. The light emitting device according to claim 1, wherein the indentation comprises:
- a recess defined by a recess surface having a wire hole through which the wire passes.

5. The light emitting device according to claim 4, wherein the recess is formed by covering with resin an additional lead connected to the wire to provide the resin molded body and separating the additional lead from the resin molded body.

6. The light emitting device according to claim 4, wherein the recess has an opening having a rectangular shape.

7. The light emitting device according to claim 1, wherein the second material is a light transmissive material.

8. The light emitting device according to claim 1, wherein the first material has a light reflectivity in an emission peak wavelength of the light emitting element of 75% or more.

9. The light emitting device according to claim 1,
wherein the first electrode lead has a first surface constituting a part of the inner surface of the element container and a second surface opposite to the first surface in a first direction perpendicular to the first surface, and
wherein the wire is connected to the second surface of the first electrode lead.

10. The light emitting device according to claim 1,
wherein the first electrode lead has a first surface constituting a part of the inner surface of the element container, and
wherein the wire does not overlap with the light emitting element when viewed in a first direction perpendicular to the first surface.

11. The light emitting device according to claim 9, wherein the wire does not overlap with the light emitting element when viewed in the first direction.

12. The light emitting device according to claim 1, wherein the wire is connected to the first electrode lead.

13. A light emitting device comprising:
- a light emitting element to emit a light;
- an element container accommodating the light emitting element and having an inner surface facing the light emitting element and an outer surface opposite to the inner surface, the element container comprising:
  - a first electrode lead electrically connected to the light emitting element and comprising:
    - an external terminal region provided on the outer surface; and
    - an internal terminal region provided in the resin molded body;
  - a second electrode lead electrically connected to the light emitting element; and
  - a resin molded body integrated with the first electrode lead and the second electrode lead and comprising:
    - a recess provided in the outer surface and separated from the first external terminal region of the first electrode lead; and
    - a wire hole via which the recess communicates with the first internal terminal region of the first electrode lead; and
- a wire provided to pass through the wire hole to electrically connected to the light emitting element via the first internal terminal region.

14. The light emitting device according to claim 13, wherein the recess is formed by covering with resin an additional lead connected to the wire to provide the resin molded body and removing the additional lead from the resin molded body.

15. The light emitting device according to claim 13, wherein the recess has an opening having a rectangular shape.

16. The light emitting device according to claim 13,
wherein the first electrode lead has a first surface constituting a part of the inner surface of the element container, and
wherein the wire is connected to the second surface of the first electrode lead.

17. The light emitting device according to claim 13,
wherein the first electrode lead has a first surface constituting a part of the inner surface of the element container, and
wherein the wire does not overlap with the light emitting element in the first direction.

18. The light emitting device according to claim 13, wherein the light emitting element is placed on the first electrode lead.

19. The light emitting device according to claim 13, further comprising:
- a light transmissive sealing member covering the light emitting element such that the wire does not contact the light transmissive sealing member.

20. The light emitting device according to claim 13, wherein the light emitting device is a side-surface light emitting type light emitting device.

* * * * *